(12) United States Patent
Wang et al.

(10) Patent No.: US 10,687,415 B2
(45) Date of Patent: Jun. 16, 2020

(54) FLEXIBLE PRINTED CIRCUIT BOARD

(71) Applicant: DALIAN CANGLONG OPTOELECTRONICS TECHNOLOGIES CO., LTD, Dalian, Liaoning (CN)

(72) Inventors: Hao Wang, Liaoning (CN); Shun Zhang, Liaoning (CN); Lin Cui, Liaoning (CN); Wenchen Zhang, Liaoning (CN); Chuanwu Liao, Liaoning (CN)

(73) Assignee: DALIAN CANGLONG OPTOELECTRONICS TECHNOLOGIES CO., LTD, Dalian, Liaoning (CN)

( * ) Notice: Subject to any disclaimer, the term of this patent is extended or adjusted under 35 U.S.C. 154(b) by 0 days.

(21) Appl. No.: 16/485,222

(22) PCT Filed: Jun. 5, 2017

(86) PCT No.: PCT/CN2017/087151
§ 371 (c)(1),
(2) Date: Aug. 12, 2019

(87) PCT Pub. No.: WO2018/149055
PCT Pub. Date: Aug. 23, 2018

(65) Prior Publication Data
US 2019/0387614 A1    Dec. 19, 2019

(30) Foreign Application Priority Data

Feb. 15, 2017  (CN) .......................... 2017 1 0080992

(51) Int. Cl.
  H05K 1/14   (2006.01)
  H05K 1/02   (2006.01)
  H05K 1/11   (2006.01)

(52) U.S. Cl.
  CPC .......... *H05K 1/0251* (2013.01); *H05K 1/118* (2013.01); *H05K 2201/094* (2013.01);
  (Continued)

(58) Field of Classification Search
  CPC .......... H05K 1/0251; H05K 1/14–147; H05K 2201/094; H05K 2201/09672; H05K 2201/09727
  See application file for complete search history.

(56) References Cited

U.S. PATENT DOCUMENTS

2006/0113109 A1* 6/2006 Koga ................ H01R 12/62
                                                          174/261
2012/0235764 A1* 9/2012 Kang ................ H01P 3/006
                                                          333/26

(Continued)

*Primary Examiner* — Hoa C Nguyen

(57) ABSTRACT

A flexible printed circuit board is disclosed, which includes a pad portion, wherein the pad portion includes a pair of first signal pads formed in a first conductor layer and respectively connected with a pair of signal wires, a pair of second signal pads formed in a second conductor layer and electrically separated from a grounding layer; a pair of first grounding pads formed in the first conductor layer and electrically separated from the pair of signal wires, wherein: the pair of first signal pads is sandwiched between the pair of first grounding pads, and a pair of second grounding pads formed in the second conductor layer and connected with the grounding layer, wherein the pair of second signal pads are sandwiched between the pair of second grounding pads. A width of the first and the second signal pads is larger than that of the signal wires.

4 Claims, 3 Drawing Sheets

(52) U.S. Cl.
CPC ............ *H05K 2201/09609* (2013.01); *H05K 2201/09672* (2013.01); *H05K 2201/09727* (2013.01)

(56) References Cited

U.S. PATENT DOCUMENTS

| | | | |
|---|---|---|---|
| 2014/0085856 A1* | 3/2014 | Shirao | H05K 1/0251 361/803 |
| 2017/0139160 A1* | 5/2017 | Noguchi | G01J 1/44 |

* cited by examiner

FLEXIBLE PRINTED CIRCUIT BOARD

CROSS REFERENCE OF RELATED APPLICATION

This is a U.S. National Stage under 35 U.S.C 371 of the International Application PCT/CN2017/087151, filed Jun. 5, 2017, which claims priority under 35 U.S.C. 119(a-d) to CN 201710080992.7, filed Feb. 15, 2017.

BACKGROUND OF THE PRESENT INVENTION

Field of Invention

The present invention relates to a flexible printed circuit board.

Description of Related Arts

In the existing optical transceiver module, the transmission rate of high-speed signals is increased from several hundred Mbps to several tens of Gbps. Inside the optical transceiver module, a printed circuit board assembly (PCBA) and a light receiving and transmitting device need to be connected by a flexible printed circuit (ITC) for adjusting assembly tolerances inside the entire optical transceiver module.

This also requires that the signal design of the flexible printed circuit board needs to meet the requirements of the bandwidth (S21) and reflection (S11) of high-speed signals of several tens of Gbps. A flexible printed circuit board usually includes a flexible substrate and a transfer circuit constructed with microstrip lines or strip lines which includes signal wires and a grounding layer. In the optical transceiver module, the flexible printed circuit board and the printed circuit board assembly are usually connected by soldering.

In the first patent document (JP-A-2007-123742), the grounding loop portion under the signal wires is excavated to match the impedance, so that the low-reflection connection requirement of −20 dB or less up to 20 GHz can be satisfied. In the second patent document (JP-A-2010-212617), to improve the performance of the bandwidth (S21) and reflection (S11), a wiring structure with reduced inductance is adopted, so that the low-reflection connection requirement of −20 dB or less up to 25 GHz can be satisfied. In the third patent document (JP-A-2014-082455) and the fourth patent document (China Patent 201310445704.5), a flexible printed circuit board having a multilayer structure is used to realize a low-reflection connection of −20 dB or less up to 40 GHz.

However, in order to achieve the reflection performance of 40 GHz, both of the third patent document and the fourth patent document increase the number of layers of the flexible printed circuit board, which makes the flexibility of the flexible printed circuit board lower, the bending becomes difficult, and the effect of adjusting assembly tolerances of the flexible printed circuit board is reduced. When the assembly is misaligned, stress is easily generated, causing the pads to be torn, thereby invalidating the product.

SUMMARY OF THE PRESENT INVENTION

An object of the present invention is to achieve a low-reflection connection of a flexible printed circuit board while maintaining flexibility without increasing the number of layers.

To achieve the above object, the present invention adopts a technical solution as follows.

A flexible printed circuit board having a first conductor layer, a second conductor layer and a dielectric layer sandwiched between the first conductor layer and the second conductor layer, wherein the flexible printed circuit board comprises:
 a pad portion for electrically connecting with a circuit substrate, and
 a wire portion for forming a transfer circuit which is connected with the circuit substrate through the pad portion, wherein the transfer circuit comprises two signal wires formed in the first conductor layer and a grounding layer formed in the second conductor layer, wherein:
 the pad portion comprises:
  a pair of first signal pads spaced from and adjacent to each other both of which are formed in the first conductor layer and respectively connected with the two signal wires,
  a pair of second signal pads spaced from and adjacent to each other both of which are formed in the second conductor layer and electrically separated from the grounding layer;
  a pair of first grounding pads both of which are formed in the first conductor layer and electrically separated from the two signal wires, wherein the pair of first signal pads are sandwiched between the pair of first grounding pads; and
  a pair of second grounding pads both of which are formed in the second conductor layer and connected with the grounding layer, wherein the pair of second signal pads are sandwiched between the pair of second grounding pads,
 wherein the pair of first signal pads are respectively connected with the pair of second signal pads through signal pad holes, the pair of first grounding pads are respectively connected with the pair of second grounding pads through grounding pad holes.

A width of each of the pair of first signal pads is larger than a width of the two signal wires respectively correspondingly connected with the two signal wires.

A conductor transition zone is provided between each of the pair of first signal pads and a corresponding signal wire, a width of the conductor transition zone is changed that firstly, the width of the conductor transition zone is increased from a junction of each of the pair of first signal pads and the conductor transition zone, and then is decreased to a junction of the conductor transition zone and the corresponding signal wire, a gap for electrically separating the pair of second signal pads from the grounding layer is provided between the pair of second signal pads and the grounding layer, the conductor transition zone is located above the gap.

The transfer circuit is a differential circuit comprising two signal wires.

Beneficial effects of the present invention are as follows.

Compared with the prior art, the present invention is able to realize a low-reflection connection of a flexible printed circuit board while maintaining flexibility without increasing the number of layers, so as to meet the requirements of the bandwidth (S21) and reflection (S11) of high-speed signals, and obtain the low reflection characteristic of −20 dB or less up to 40 GHz.

Figure 1:
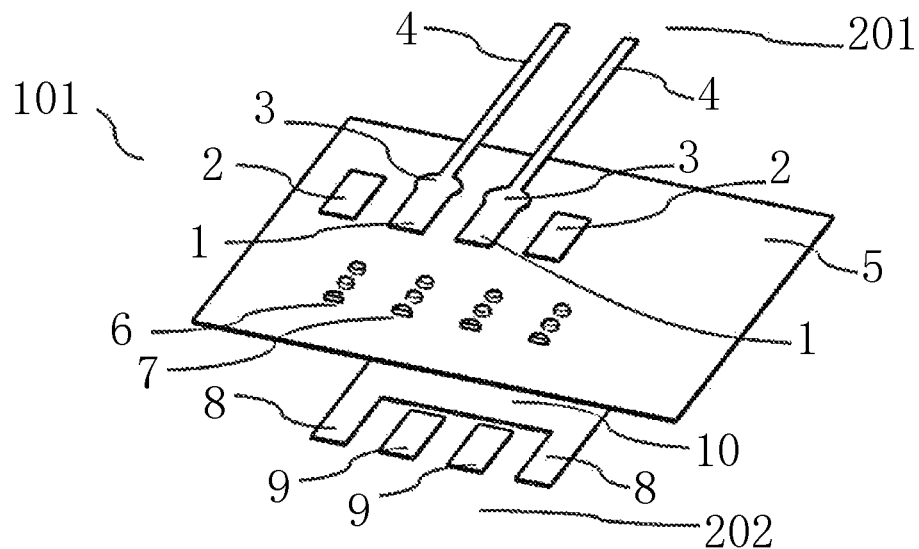
FIG. 1 is an exploded perspective view of a flexible printed circuit board provided by the present invention.
Figure 2:
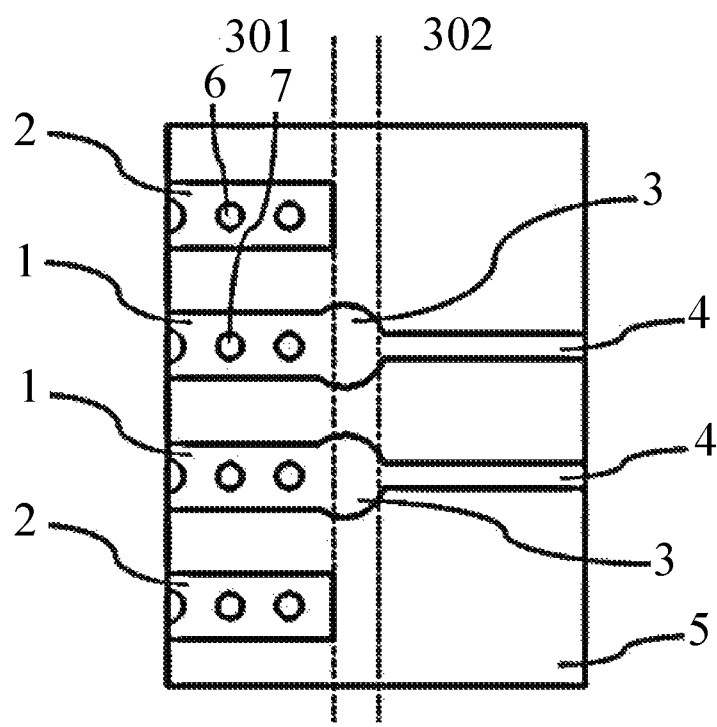
FIG. 2 is a schematic view of a first conductor layer of the flexible printed circuit board provided by the present invention.
Figure 3:
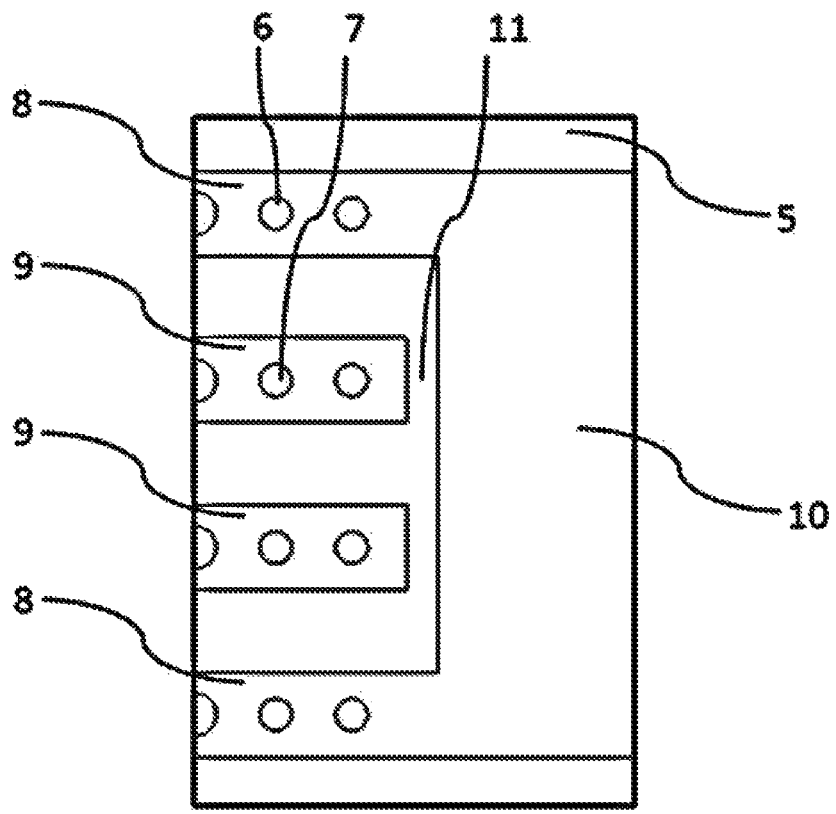
FIG. 3 is a schematic view of a second conductor layer of the flexible printed circuit board provided by the present invention.

In the drawings, 1: first signal pad; 2: first grounding pad; 3: conductor transition zone of the present invention; 4: signal wire; 5: dielectric layer; 6: grounding pad hole; 7: signal pad hole; 8: second grounding pad; 9: second signal pad; 10: grounding layer; 11: gap for electrically separating the second signal pads from the grounding layer; 12: conductor transition zone between a signal pad and a signal wire of a comparative example; 101: lexible printed circuit board provided by the present invention; 102: flexible printed circuit board of the comparative example; 201: first conductor layer; 202: second conductor layer; 301: pad portion; 302: wire portion; a1: width of the first signal pad of the present invention; b1: width of a conductor transition zone between a first signal pad and a corresponding signal wire of the present invention; c1: width of the signal wires of the present invention; a2: width of a signal pad of the comparative example; b1: width of a conductor transition zone between a signal pad and a corresponding signal wire of the comparative example; c1: width of the signal wire of the comparative example.

DETAILED DESCRIPTION OF THE PREFERRED EMBODIMENT

As shown in FIGS. 1 to 4 of the drawings, a flexible printed circuit board 101 provided by the present invention has a first conductor layer 201, a second conductor layer 202 and a dielectric layer 5 sandwiched between the first conductor layer 201 and the second conductor layer 202.

According to the present invention, the flexible printed circuit board 101 comprises a pad portion 301 for electrically connecting with an external device and a wire portion 302 for transmitting signals. The wire portion 302 is a differential circuit constructed with microstrip lines which comprises a pair of signal wires 4 formed in the first conductor layer 201 and a grounding layer 10 formed in the second conductor layer 202. The pad portion 301 comprises a pair of first signal pads 1 and a pair first grounding pads 2 all of which are formed in the first conductor layer 201, and a pair of second signal pads 9 and a pair of second grounding pads 8 all of which are formed in the second conductor layer 202. The pair of first signal pads 1 are respectively electrically connected with the pair of second signal pads 9 through signal pad holes 7. The pair of first grounding pads 2 are respectively electrically connected with the pair of second grounding pads 8 through grounding pad holes 6.

In the flexible printed circuit board provided by the present invention, a width a1 of each of the pair of first signal pads 1 formed in the first conductor layer 201 is larger than a width c1 of a corresponding signal wire 4. The width a1 of the pair of first signal pads 1 is generally set by the specification of MSA (Multi Source Agreement), and is usually about 0.4 mm. However, it is also possible to be a width different from the existing specifications. The width c1 of the pair of signal wires 4 is calculated from the structure of the specific impedance microstrip lines. Generally, in the case of the differential 100 ohm impedance, the width c1 of the pair of signal wires 4 is usually about 0.1 mm, but it is also possible to be a width different from the existing calculation.

In the flexible printed circuit board 101 according to the preferred embodiment of the present invention, a conductor transition zone 3 is provided between a first signal pad and a corresponding signal wire. A width of the conductor transition zone is changed as below. Firstly, the width of the conductor transition zone is increased from a junction of the first signal pad and the conductor transition zone, and then is decreased to a junction of the conductor transition zone and the corresponding signal wire. A gap 11 is provided between the pair of second signal pads and the grounding layer for electrically separating from each other.

Figure 4:
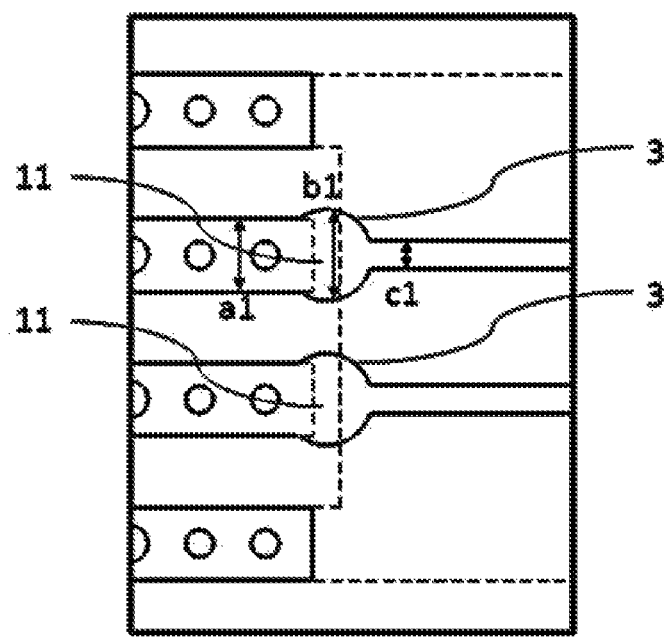
FIG. 4 is a perspective view of the flexible printed circuit board provided by the present invention.

It can be seen from the perspective view of the flexible printed circuit board provided by the present invention of FIG. 4, the conductor transition zone 3 is just located above the gap for electric separation to compensate for its impedance characteristics. The gap is configured to electrically separate the pair of second signal pads 9 from the grounding layer 10, which results in that no grounding layer is provided below the conductor transition zone 3 to provide a signal loop, so that the microstrip line structure is destroyed, causing the impedance is increased and inductive. In order to ensure impedance matching, it is necessary to compensate in the conductor transition zone 3 to increase the capacitance, so that the impedance is decreased to compensate for the increased impedance caused by the destruction of the microstrip line structure. In order to increase the capacitance, it is necessary to increase an area of the conductor transition zone 3, that is, to increase the width b1 of the conductor transition zone between the first signal pad and the corresponding signal wire of the flexible printed circuit board provided by the present invention. In this case, the conductor width of the first conductor layer 201 is changed in such a manner that the width b1 of the conductor transition zone is larger than the width a1 of each of the pair of first signal pads, and the width a1 of each of the pair of first signal pads is larger than the width c1 of the corresponding signal wire 4, that is, b1>a1>c1. Generally, in the case of the differential 100 ohm impedance, the width b1 of the conductor transition zone is calculated to be about 0.5 mm, but it is also possible to be a width different from the existing calculation.

Figure 5:
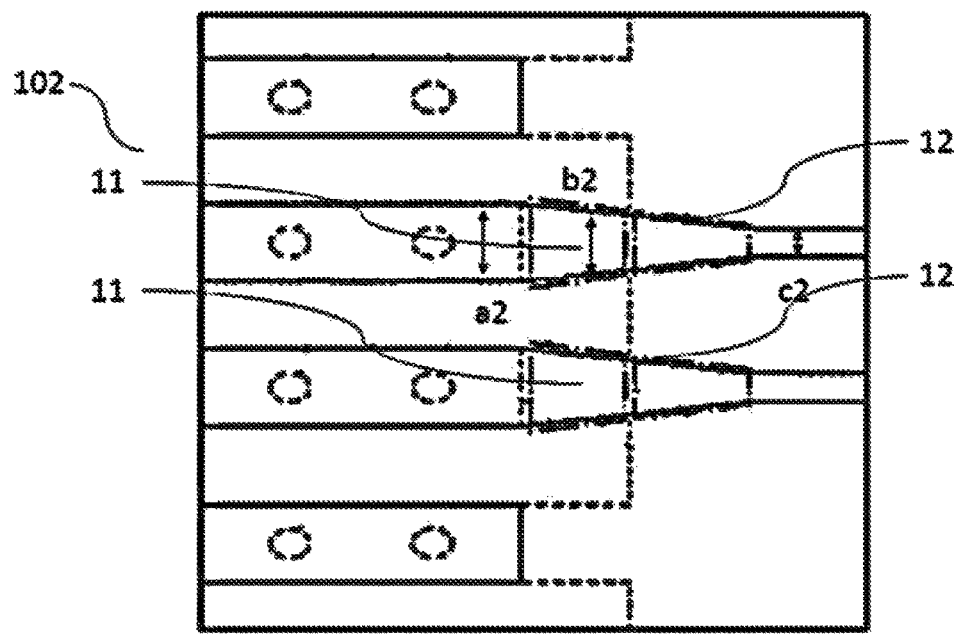
FIG. 5 is a perspective view of a flexible printed circuit board of a comparative example.

It can be seen from the perspective view of the flexible printed circuit board provided by a comparative example of FIG. 5, in the conventional flexible printed circuit board, a width b2 of a conductor transition zone between a signal pad and a signal wire of the comparative example is usually between a width a2 of the signal pad of the comparative example and a width c2 of the signal wire of the comparative example, that is, a2>b2>c2, showing a successive variation. In this case, the conductor transition zone 12 between the signal pad and the signal wire of the comparative example does not provide capacitive compensation, resulting in impedance mismatch.

Figure 6:
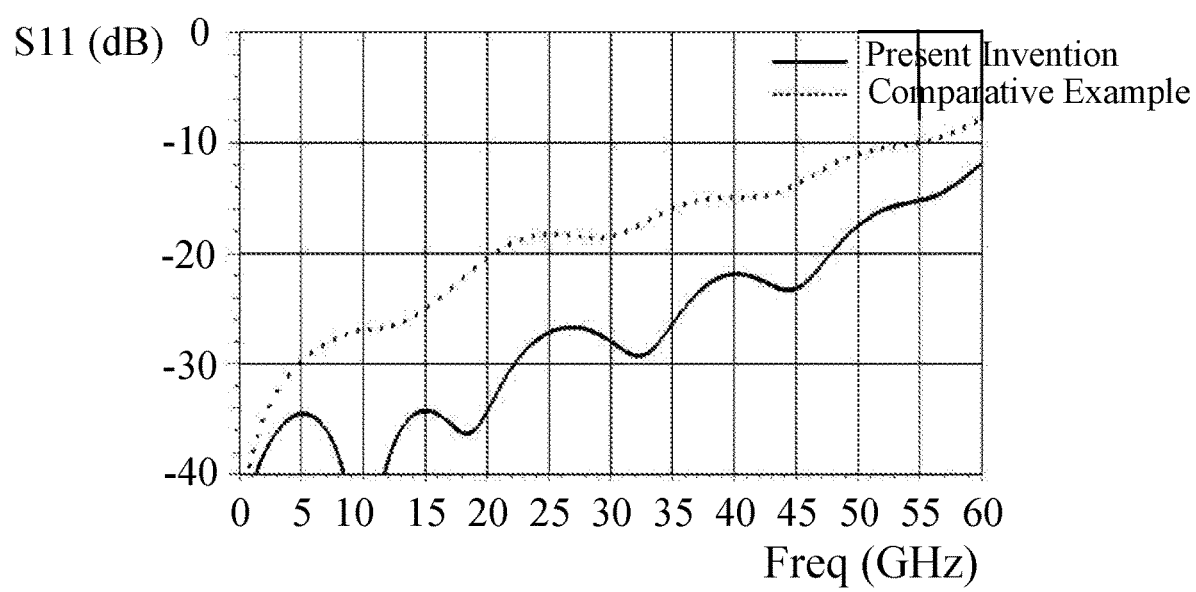
FIG. 6 is a reflection characteristic curve diagram of the flexible printed circuit board provided by the present invention and the flexible printed circuit board of the comparative example.

It can be seen from the reflection characteristic curve of FIG. 6, a reflection of −20 dB is produced at 20 GHz in the comparative example. Compared with the comparative example, the flexible printed circuit board provided by the present invention has a low reflection connection with a reflection coefficient (S11) of −20 dB up to 48 GHz.

INDUSTRIAL APPLICABILITY

The present invention provides a flexible printed circuit board capable of realizing a low-reflection connection of a flexible printed circuit board while maintaining flexibility without increasing the number of layers, so as to meet the requirements of the bandwidth (S21) and reflection (S11) of high-speed signals, and obtain the low reflection characteristic of −20 dB or less up to 40 GHz.

What is claimed is:

1. A flexible printed circuit board having a first conductor layer, a second conductor layer and a dielectric layer sandwiched between the first conductor layer and the second conductor layer, wherein the flexible printed circuit board comprises:
   a pad portion for electrically connecting with a circuit substrate, and
   a wire portion for forming a transfer circuit which is connected with the circuit substrate through the pad portion wherein the transfer circuit comprises two signal wires formed in the first conductor layer and a grounding layer formed in the second conductor layer, wherein:
   the pad portion comprises:
      a pair of first signal pads spaced from and adjacent to each other both of which are formed in the first conductor layer and respectively connected with the two signal wires,
      a pair of second signal pads spaced from and adjacent to each other both of which are formed in the second conductor layer and electrically separated from the grounding layer;
      a pair of first grounding pads both of which are formed in the first conductor layer and electrically separated from the two signal wires, wherein the pair of first signal pads are sandwiched between the pair of first grounding pads; and
      a pair of second grounding pads both of which are formed in the second conductor layer and connected with the grounding layer, wherein the pair of second signal pads are sandwiched between the pair of second grounding pads,
   wherein the pair of first signal pads are respectively connected with the pair of second signal pads through signal pad holes, the pair of first grounding pads are respectively connected with the pair of second grounding pads through grounding pad holes;
   a conductor transition zone is provided between each of the pair of first signal pads and a corresponding signal wire, a width of the conductor transition zone is changed that firstly, the width of the conductor transition zone is increased from a junction of each of the pair of first signal pads and the conductor transition zone, and then is decreased to a junction of the conductor transition zone and the corresponding signal wire, a gap for electrically separating the pair of second signal pads from the grounding layer is provided between the pair of second signal pads and the grounding layer, the conductor transition zone is located above the gap.

2. The flexible printed circuit board, as recited in claim 1, wherein: the transfer circuit is a differential circuit comprising the two signal wires.

3. The flexible printed circuit board, as recited in claim 2, wherein: a width of each of the pair of first signal pads is larger than a width of the two signal wires respectively correspondingly connected with the pair of first signal pads.

4. The flexible printed circuit board, as recited in claim 1, wherein: a width of each of the pair of first signal pads is larger than a width of the two signal wires respectively correspondingly connected with the pair of first signal pads.

* * * * *